United States Patent
Hsu et al.

(10) Patent No.: US 11,522,000 B2
(45) Date of Patent: Dec. 6, 2022

(54) SEMICONDUCTOR PACKAGE STRUCTURE AND MANUFACTURING METHOD THEREOF

(71) Applicant: Powertech Technology Inc., Hsinchu County (TW)

(72) Inventors: Hung-Hsin Hsu, Hsinchu County (TW); Wen-Hsiung Chang, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 177 days.

(21) Appl. No.: 16/856,011

(22) Filed: Apr. 22, 2020

(65) Prior Publication Data

US 2021/0098517 A1    Apr. 1, 2021

(30) Foreign Application Priority Data

Sep. 27, 2019   (TW) .................................. 108135048

(51) Int. Cl.
*H01L 27/14*    (2006.01)
*H01L 27/146*   (2006.01)

(52) U.S. Cl.
CPC .. *H01L 27/14618* (2013.01); *H01L 27/14623* (2013.01); *H01L 27/14636* (2013.01); *H01L 27/14685* (2013.01); *H01L 27/14698* (2013.01)

(58) Field of Classification Search
CPC ......... H01L 27/14618; H01L 27/14623; H01L 27/14625; H01L 21/563
See application file for complete search history.

(56) References Cited

U.S. PATENT DOCUMENTS 6,441,478 B2 * 8/2002 Park ................. H01L 23/49816
                                                  257/710
6,864,116 B1 * 3/2005 Kim ................. H01L 27/14618
                                                  438/65

(Continued)

FOREIGN PATENT DOCUMENTS

| TW | 200534459 | 10/2005 |
| TW | 201813066 | 4/2018 |
| TW | 201929159 | 7/2019 |

OTHER PUBLICATIONS

"Office Action of Taiwan Counterpart Application", dated Aug. 31, 2020, p. 1-p. 9.

*Primary Examiner* — Mounir S Amer
*Assistant Examiner* — Alexander Belousov
(74) *Attorney, Agent, or Firm* — JCIPRNET

(57) ABSTRACT

A semiconductor package structure including a sensor die, a substrate, a light blocking layer, a circuit layer, a dam structure and an underfill is provided. The sensor die has a sensing surface. The sensing surface includes an image sensing area and a plurality of conductive bumps. The substrate is disposed on the sensing surface. The light blocking layer is located between the substrate and the sensor die. The circuit layer is disposed on the light blocking layer. The sensor die is electrically connected to the circuit layer by the conductive bumps. The dam structure is disposed on the substrate and surrounds the image sensing area. Opposite ends of the dam structure directly contact the sensor die and the light blocking layer. The underfill is disposed between the dam structure and the conductive bumps.

8 Claims, 9 Drawing Sheets

(56) References Cited

U.S. PATENT DOCUMENTS

| | | | |
|---|---|---|---|
| 7,443,038 B2* | 10/2008 | Kinsman | H01L 27/14634 |
| | | | 257/772 |
| 9,397,078 B1* | 7/2016 | Chandolu | H01L 25/18 |
| 10,615,212 B2* | 4/2020 | Jung | H01L 27/14636 |
| 2002/0008315 A1* | 1/2002 | Park | H01L 27/14618 |
| | | | 257/E21.503 |
| 2005/0104186 A1* | 5/2005 | Yang | H01L 31/0203 |
| | | | 257/688 |
| 2018/0012865 A1* | 1/2018 | Schrock | H01L 23/3675 |
| 2019/0043907 A1* | 2/2019 | Wu | H01L 27/14618 |
| 2019/0189667 A1* | 6/2019 | Jung | H01L 24/20 |
| 2020/0098691 A1* | 3/2020 | Itotani | H01L 23/3142 |

* cited by examiner

SEMICONDUCTOR PACKAGE STRUCTURE AND MANUFACTURING METHOD THEREOF

CROSS-REFERENCE TO RELATED APPLICATION

This application claims the priority benefit of Taiwan application serial no. 108135048, filed on Sep. 27, 2019. The entirety of the above-mentioned patent application is hereby incorporated by reference herein and made a part of this specification.

BACKGROUND

Field of the Invention

The invention relates to a semiconductor package structure and a manufacturing method thereof, and more particularly, to a semiconductor package structure having a dam structure and a manufacturing method thereof.

Description of Related Art

In order to make electronic products design light, thin, short and small, semiconductor packaging technology is continuing to improve, in an attempt to develop products that are smaller, lighter, more integrated, and more competitive in the market. For instance, how to make a package thickness thinner has become a challenge.

SUMMARY

The invention provides a semiconductor package structure and a manufacturing method thereof, which can make the package thickness thinner and reduce the possibility that the image recognition is affected by the underfill overflowing into the image sensing area.

The invention provides a semiconductor package structure, which includes a sensor die, a substrate, a light blocking layer, a circuit layer, a dam structure and an underfill. The sensor die has a sensing surface. The sensing surface includes an image sensing area and a plurality of conductive bumps. The substrate is disposed on the sensing surface. The light blocking layer is located between the substrate and the sensor die. The circuit layer is disposed on the light blocking layer. The sensor die is electrically connected to the circuit layer by the conductive bumps. The dam structure is disposed on the substrate and surrounds the image sensing area. Opposite ends of the dam structure directly contact the sensor die and the light blocking layer. The underfill is disposed between the dam structure and the conductive bumps.

The invention further provides a manufacturing method of a semiconductor package structure, which at least includes the following steps. A light blocking layer is formed on a substrate. A circuit layer is formed on the light blocking layer. A dam structure is formed on the circuit layer. A sensor die is provided. The sensor die has a sensing surface. The sensing surface includes an image sensing area and a plurality of conductive bumps. The sensor die is disposed on the circuit layer. The dam structure is disposed between the plurality of conductive bumps and the image sensing area. The dam structure, the sensor die and the substrate constitute a cavity. The underfill is formed between the dam structure and the conductive bumps.

Based on the above, the sensor die of the invention may be electrically connected to the circuit layer by the conductive bumps. The dam structure is disposed on the substrate and surrounds the image sensing area, and the opposite ends of the dam structure directly contact the sensor die and the light blocking layer. Accordingly, the package thickness can be made thinner, and the possibility that the image recognition is affected by the underfill overflowing into the image sensing area can be reduced.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1G is a cross-sectional view of FIG. 2 taken along a section line B-B'.

DESCRIPTION OF THE EMBODIMENTS

Figure 1A:
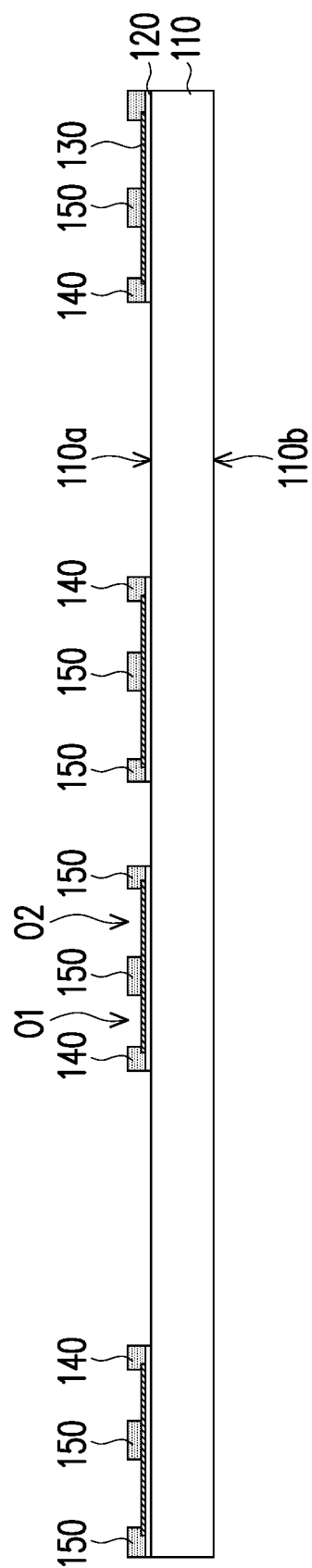
FIG. 1A to FIG. 1G are partial cross-sectional views showing a manufacturing method of a semiconductor package structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Directional terminology (e.g., top, down, right, left, front, rear, top, and bottom) is used with reference to the orientation of the Figure(s) being described. As such, the directional terminology is used for purposes of illustration and is in no way limiting.

Unless otherwise clearly indicated, the method in this disclosure should not be construed as requiring steps therein to be performed in a particular order.

The invention will be described more comprehensively below with reference to the drawings for the embodiments. However, the invention may also be implemented in different forms rather than being limited by the embodiments described in the invention. Thicknesses, dimensions and sizes of layers and regions in the drawings are exaggerated for clarity. The same reference numbers are used in the drawings and the description to indicate the same or like parts, which are not repeated in the following embodiments.

Figure 1B:
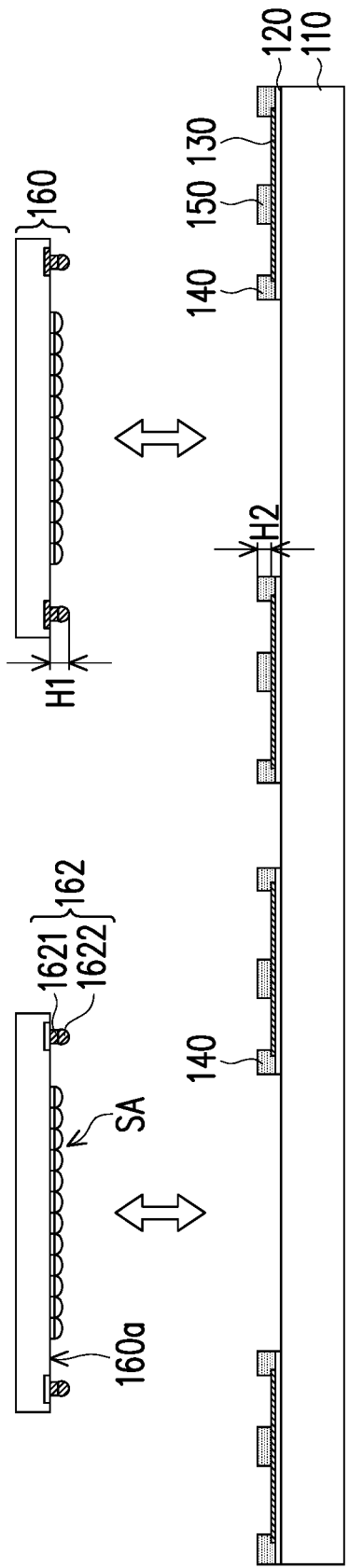
Figure 1C:
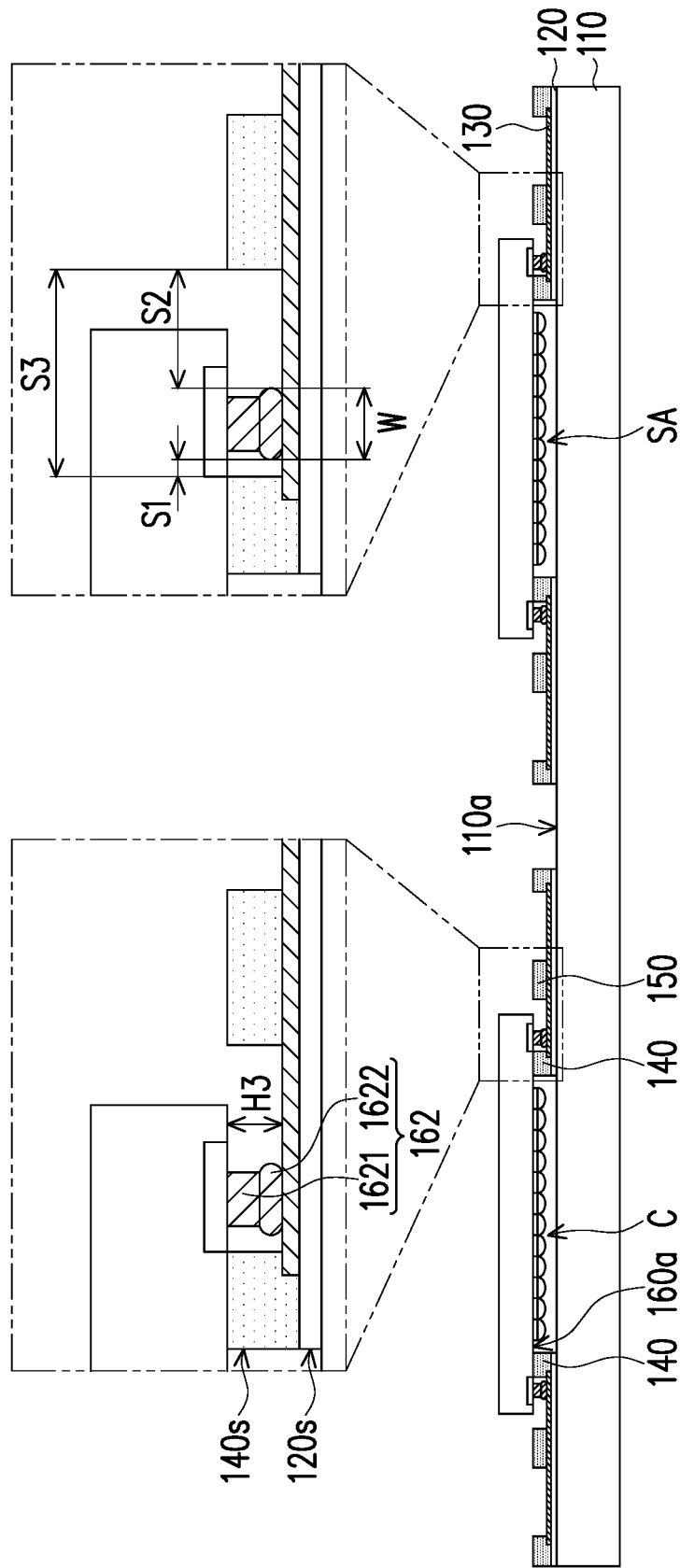
Figure 1D:
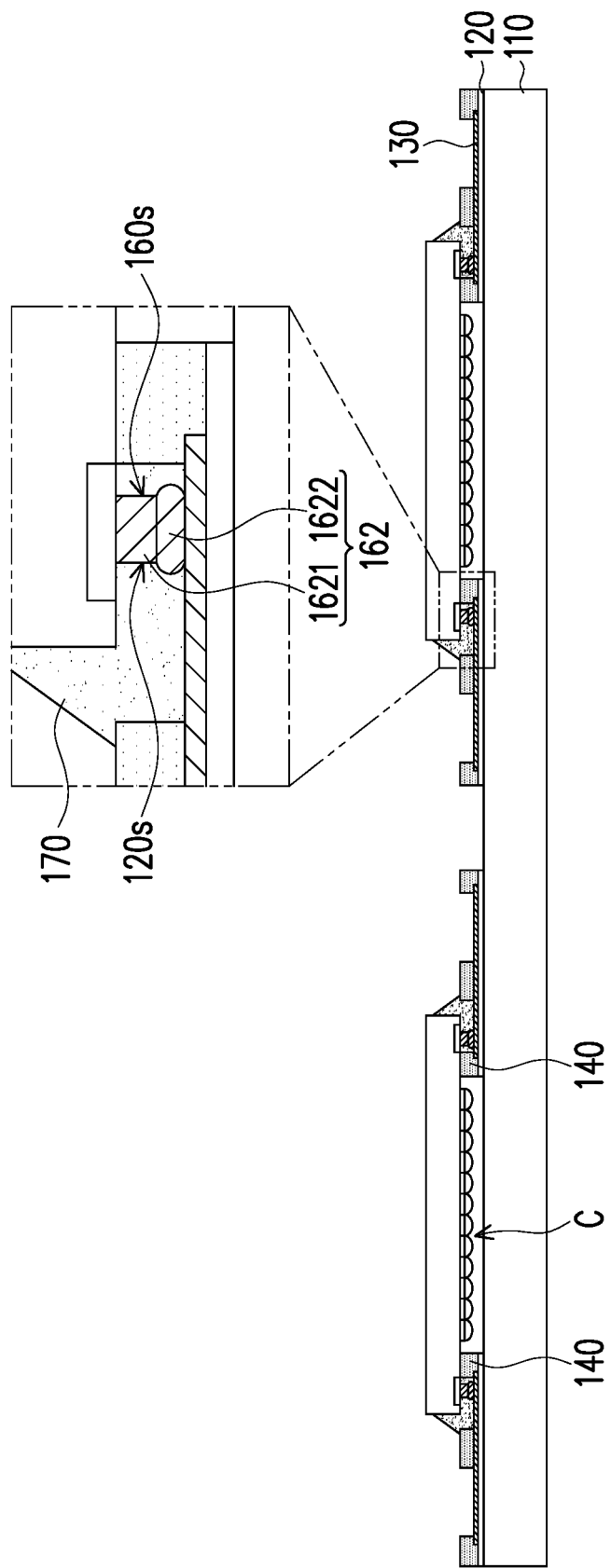
Figure 1E:
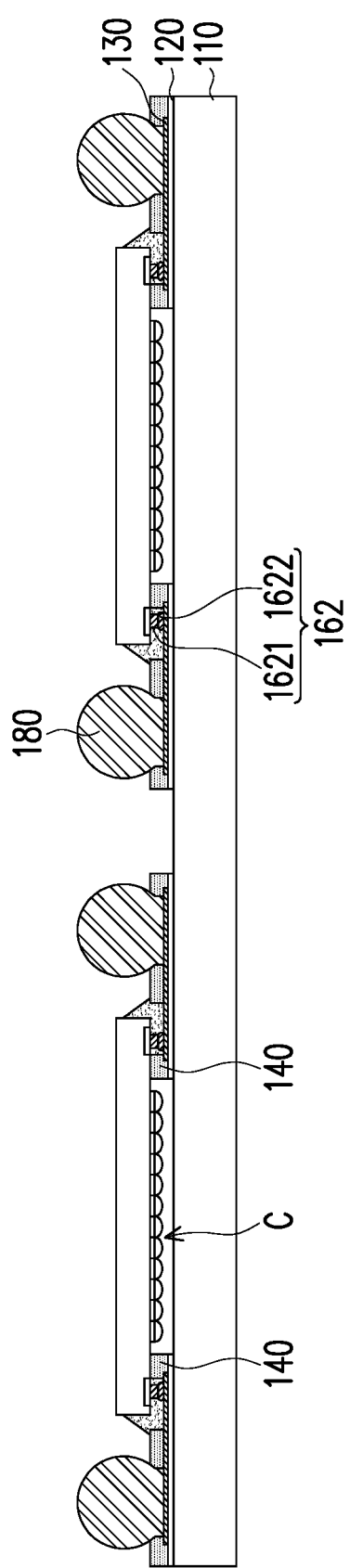
Figure 1F:
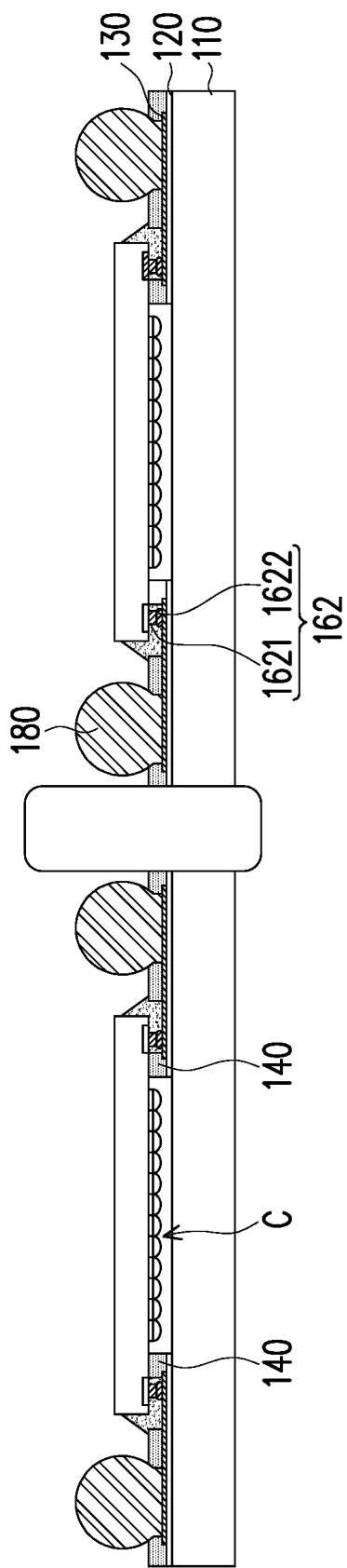
Figure 1G:
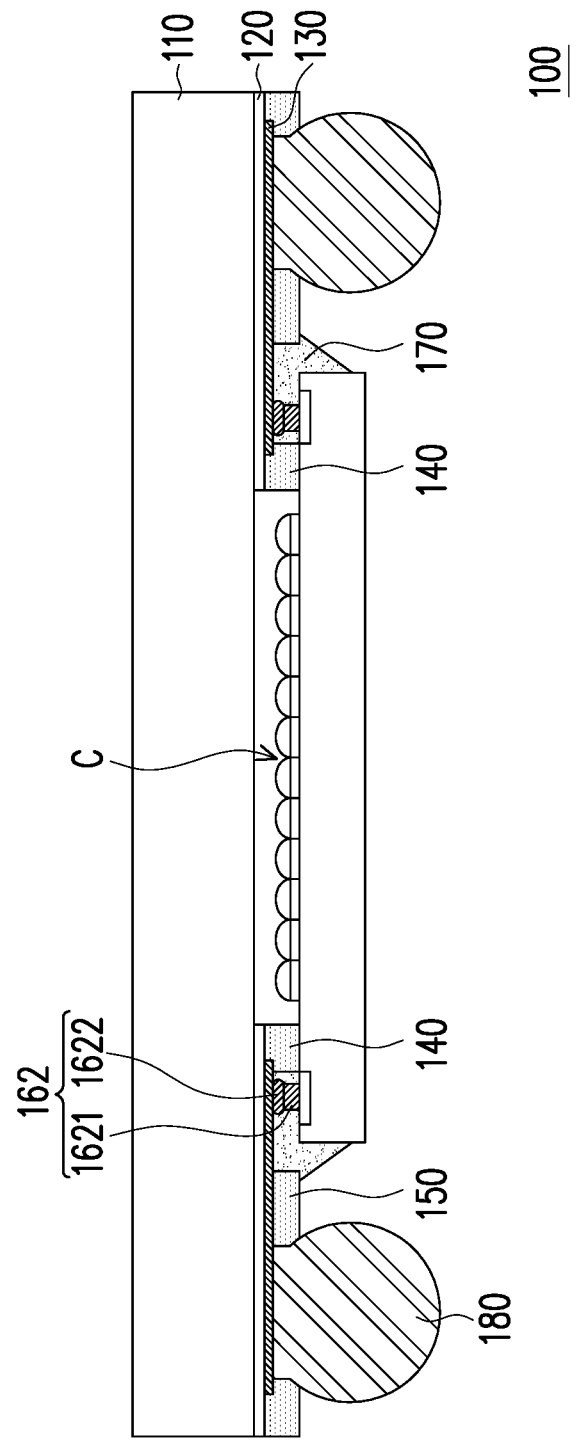
Figure 2:
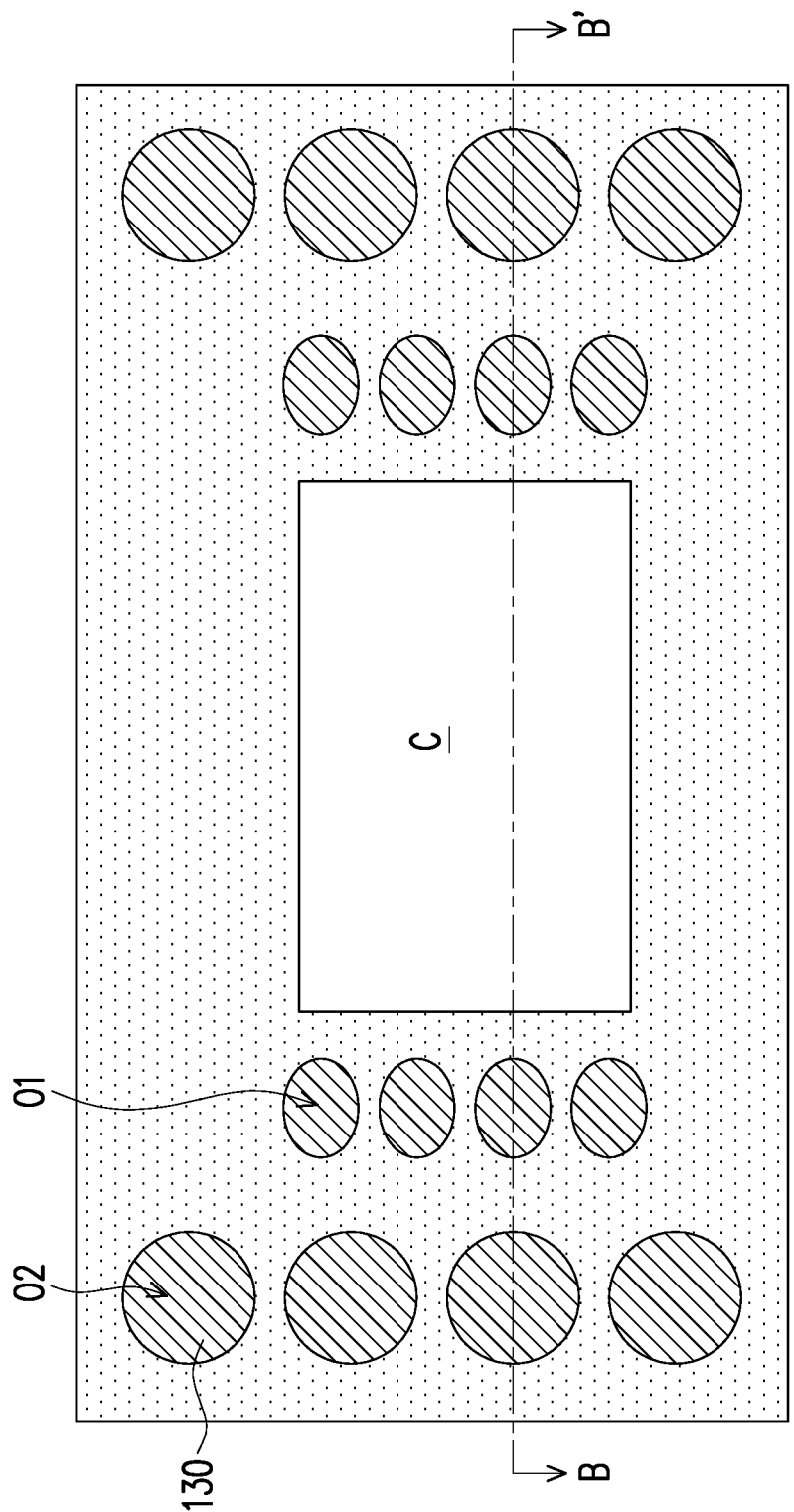
FIG. 2 is a top view of a part of the semiconductor package structure according to an embodiment of the invention.

FIG. 1A to FIG. 1G are partial cross-sectional views showing a manufacturing method of a semiconductor package structure according to an embodiment of the invention. FIG. 1G is a cross-sectional view of FIG. 2 taken along a section line B-B'. FIG. 2 is a top view of a part of the semiconductor package structure according to an embodiment of the invention.

In this embodiment, a manufacturing method of a semiconductor package structure 100 may include the following steps.

Referring to FIG. 1A, a substrate 110 is provided. The substrate 110 has a first surface 110a and a second surface 110b opposite to the first surface 110a. In an embodiment, the substrate 110 may be a glass substrate, but the invention is not limited thereto.

Referring to FIG. 1A, next, a light blocking layer 120 is formed on the first surface 110a of the substrate 110. A material of the light blocking layer 120 is, for example, a black layer or other similar insulating light blocking layer. For instance, the light blocking layer 120 may be formed by coating, printing, exposure and developing, or other suitable method, which are not limited in the invention.

Referring to FIG. 1A, next, a circuit layer 130 is formed on the light blocking layer 120. In this embodiment, the circuit layer 130 is a single layer structure, but the invention is not limited thereto. In an embodiment not illustrated, the circuit layer 130 may be a multilayer structure. For instance, the circuit layer 130 may include a dielectric layer and a patterned conductive layer. Here, the patterned conductive layer can redistribute wires used in a signal transmission for a die package. In an embodiment, the circuit layer 130 may also be referred to as a redistribution layer (RDL).

Referring to FIG. 1A and FIG. 2 together, a dam structure 140 and an insulating layer 150 are formed on the circuit layer 130. In this embodiment, the dam structure 140 and the insulating layer 150 may be formed by the same or similar manufacturing process. For instance, the dam structure 140 and/or the insulating layer 150 may be formed by coating, printing, exposure and developing, or other suitable method, which are not limited in the invention.

In an embodiment, the dam structure 140 and/or the insulating layer 150 may include a solder resist material, but the invention is not limited thereto. For instance, the dam structure 140 and/or the insulating layer 150 may be a solder mask.

As shown in FIG. 2, in this embodiment, the dam structure 140 and the insulating layer 150 may be a continuous structure, but the invention is not limited thereto.

In this embodiment, the insulating layer 150 and the dam structure 140 may constitute a plurality of openings O1, and insulating layer 150 may include a plurality of openings O2. Here, the openings O1 and the openings O2 may expose a part of the circuit layer 130.

In an embodiment, the circuit layer 130 may expose a part of the light blocking layer 120, and the dam structure 140 may be formed on the part of the light blocking layer 120 exposed by the circuit layer 130.

Referring to FIG. 1B, a sensor die 160 is provided. The sensor die 160 has a sensing surface 160a. Here, the sensing surface 160a includes an image sensing area SA and a plurality of conductive bumps 162.

In an embodiment, the sensor die 160 is, for example, an image sensor die, but the invention is not limited thereto.

In this embodiment, as shown in FIG. 1B, before the sensor die 160 is disposed on the circuit layer 130, the conductive bumps 162 have a first height H1, the dam structure 140 has a second height H2 protruding beyond the circuit layer 130, and the first height H1 is greater than or equal to the second height H2. In this way, the probability that the conductive bump 162 cannot contact the circuit layer 130 after being disposed on the circuit layer 130 may be reduced.

Referring to FIG. 1B, FIG. 1C and FIG. 2 together, the sensor die 160 is disposed on the circuit layer 130 such that the dam structure 140 is located between the conductive bumps 162 and the image sensing area SA.

As shown by FIG. 2, in this embodiment, the conductive bump 162 of the sensor die 160 is disposed in the opening O1. A projecting range of the conductive bumps 162 on the substrate 110 is located within a projecting range of the openings O1 on the substrate 110. In other words, the conductive bump 162 may not be completely filled in the opening O1. In this embodiment, the sensor die 160 may be electrically connected to the circuit layer 130 by the conductive bumps 162. Therefore, the package thickness can be made thinner.

In this embodiment, after the sensor die 160 is disposed on the circuit layer 130, opposite ends of the dam structure 140 may directly contact the sensor die 160 and the light blocking layer 120.

Referring to FIG. 1B and FIG. 1C together, after the sensor die 160 is disposed on the circuit layer 130, the conductive bumps 162 may be electrically connected to the circuit layer 130. For instance, the conductive bumps 162 may be heated so that the conductive bumps 162 directly contact the circuit layer 130.

In this embodiment, a part of the conductive bumps 162 may include a solder. For instance, the conductive bump 162 may include a conductive pillar 1621 and a solder ball 1622. The conductive pillar 1621 is, for example, a copper pillar or a gold pillar, but the invention is not limited thereto. In addition, as shown in FIG. 1C, the conductive bump 162 after heating has a third height H3. Examples of the method of heating include a reflow process.

It should be noted that a shape of the conductive bump 162 before heating (as shown in FIG. 1B) may be slightly different from a shape of the conductive bump 162 after heating (shown in FIG. 1C).

In this embodiment, a gap may be provided between the conductive bump 162 after heating and the dam structure 140, but the invention is not limited thereto. For instance, as shown in FIG. 1C, after the conductive bumps 162 are heated, a minimum space between the conductive bump 162 and the dam structure 140 is a first space S1.

In this embodiment, a gap may be provided between the conductive bump 162 after heating and the insulating layer 150, but the invention is not limited thereto. For instance, as shown in FIG. 1C, after the conductive bumps 162 are heated, a minimum space between the conductive bump 162 and the insulating layer 150 is a second space S2.

In this embodiment, a gap may be provided between the conductive bump 162 after heating and the dam structure 140 and a gap may be provided between the conductive bump 162 after heating and the insulating layer 150, but the invention is not limited thereto. For instance, as shown in FIG. 1C, after the conductive bumps 162 are heated, an aperture of the opening O1 constituted between insulating layer 150 and the dam structure 140 may include a maximum space S3, and a maximum width W of the conductive bump 162 after heating is less than the maximum space S3.

In this embodiment, the first height H1 of the conductive bump 162 before heating may be greater than the second height H2 of the dam structure 140 protruding beyond the circuit layer 130, and the third height H3 of the conductive bump 162 after heating may be less than the first height H1.

In an embodiment not illustrated, a height of the conductive bump 162 before heating (e.g., similar to the first height H1 marked) may be equal to the second height H2 of the dam structure 140 protruding beyond the circuit layer 130, and a height of the conductive bump 162 after heating (e.g., similar to the third height H3 marked) may be equal to the height of the conductive bump 162 before heating.

Referring to FIG. 1C, next, in this embodiment, after the sensor die 160 is disposed on the circuit layer 130, the sensor die 160, the dam structure 140, the light blocking layer 120 and the substrate 110 can constitute a cavity C.

In an embodiment, the cavity C may be a space constituted by the sensing surface 160a of the sensor die 160, a sidewall 140s of the dam structure 140, a sidewall 120s of the light blocking layer 120 and the first surface 110a of the substrate 110.

In an embodiment, the sidewall 140s of the dam structure 140 close to the image sensing area SA may be substantially aligned with the sidewall 120s of the light blocking layer 120 close to the image sensing area SA.

In this embodiment, the step of disposing the sensor die 160 on the circuit layer 130 may be performed in a first ambient pressure. Further, after the dam structure 140 directly contacts the sensor die 160 to constitute the cavity C, a second ambient pressure may be provided outside the cavity C, and the second ambient pressure is greater than the first ambient pressure. In this way, the contact between the sensing die 160 and the dam structure 140 can be made closer by the difference in air pressure. In an embodiment, the first ambient pressure is, for example, less than or equal to 300 torr, and the second ambient pressure is, for example, close to 760 torr.

In an embodiment, if an underfill dispensing step (e.g., a step of subsequently forming an underfill 170) is not performed and the structure illustrated in FIG. 1C is placed under the atmosphere of the second ambient pressure for a long time, an air pressure inside the cavity C may be greater than the first ambient pressure.

Referring to FIG. 1D, the underfill 170 is formed between the dam structure 140 and the conductive bumps 160 and between the conductive bumps 162 and the insulating layer 150. In other words, the underfill 170 may be disposed between the dam structure 140 and the conductive bumps 160 and between the conductive bumps 162 and the insulating layer 150.

In this embodiment, the underfill 170 may completely cover a sidewall 160s of the conductive bump 160, a sidewall of the dam structure 140 close to the conductive bump 160 and a sidewall of the insulating layer 150 close to the conductive bump 160. Here, the sidewall 160s of the conductive bump 160 may include sidewalls of the conductive bumps 160 close to the dam structure 140 and close to the insulating layer 150.

In this embodiment, the dam structure can reduce the possibility that the underfill 170 overflows into the image sensing area SA.

Referring to FIG. 1E, a plurality of conductive terminals 180 are formed on the circuit layer 130. The conductive terminal 180 is, for example, a solder ball, but the invention is not limited thereto. In this embodiment, a signal transmission path of the sensor die 160 may be connected to an external signal by the conductive terminal 180 via the conductive bump 162 and the circuit layer 130. In this way, the cost of through silicon via (TSV) may be eliminated to reduce the production cost of the semiconductor package structure 100.

Referring to FIG. 1F and FIG. 1G together, after the conductive terminals 180 are formed, a saw process or a singulation process may be performed to obtain a plurality of the semiconductor package structures 100. The singulation process includes, for example, cutting with a rotating blade or a laser beam.

After the above processes, the manufacturing process of the semiconductor package structure 100 of the present embodiment can be substantially completed. The semiconductor package structure 100 includes the sensor die 160, the substrate 110, the light blocking layer 120, the circuit layer 130, the dam structure 140 and the underfill 170. The sensor die 160 has the sensing surface 160a. The sensing surface 160a includes the image sensing area SA and the conductive bumps 160. The substrate 110 is disposed on the sensing surface 160a. The light blocking layer 120 is located between the substrate 110 and the sensor die 160. The circuit layer 130 is disposed on the light blocking layer 120. The sensor die 160 is electrically connected to the circuit layer 130 by the conductive bumps 162. The dam structure 140 is disposed on the substrate 110 and surrounds the image sensing area SA. The opposite ends of the dam structure 140 directly contact the sensor die 160 and the light blocking layer 120. The underfill 170 is disposed between the dam structure 140 and the conductive bumps 160.

Figure 3:
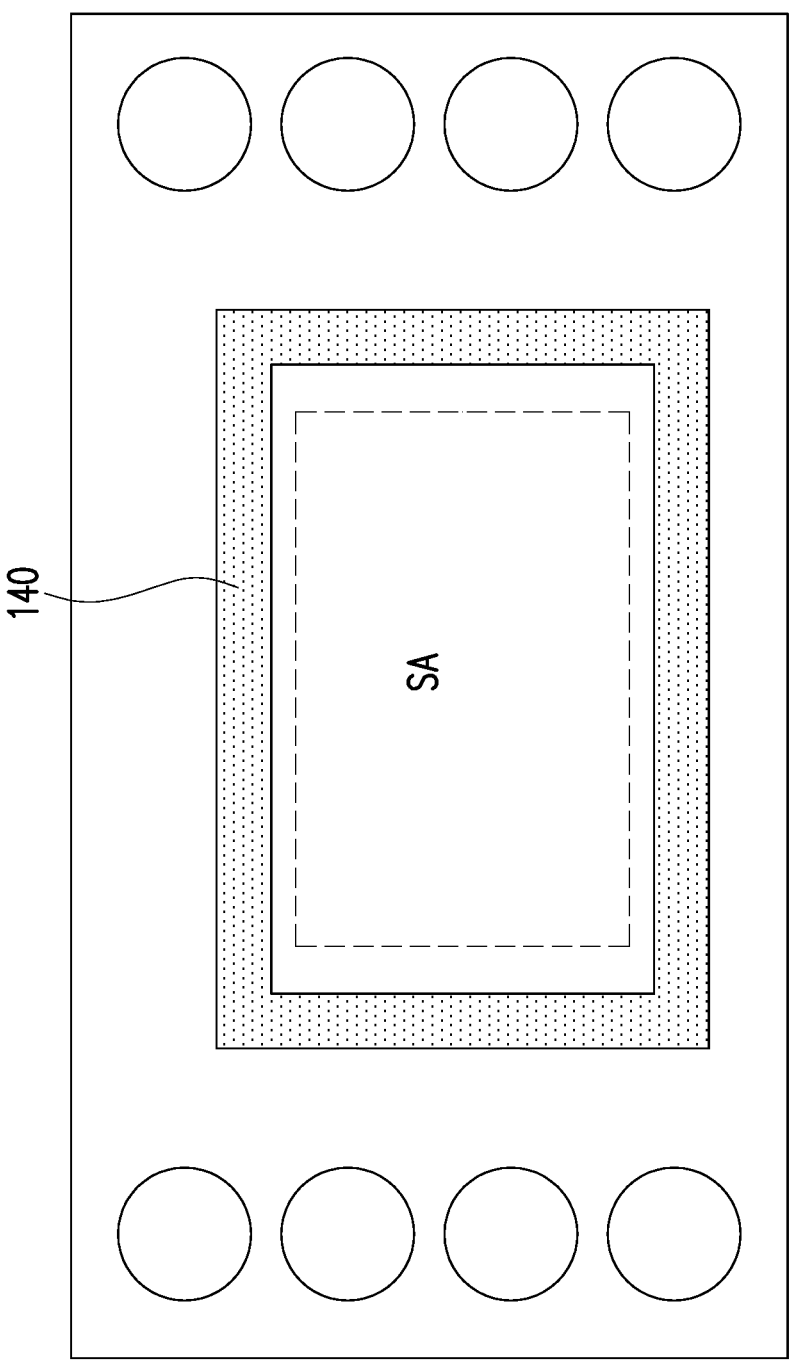
FIG. 3 is a top view of a part of the semiconductor package structure according to an embodiment of the invention.

FIG. 3 is a top view of a part of the semiconductor package structure according to an embodiment of the invention.

Referring to FIG. 3, in this embodiment, the dam structure 140 may be a ring shape structure that surrounds the image sensing area SA of the sensor die 160.

In summary, the sensor die of the invention may be electrically connected to the circuit layer by the conductive bumps. The dam structure is disposed on the substrate and surrounds the image sensing area, and the opposite ends of the dam structure directly contact the sensor die and the light blocking layer. Accordingly, the package thickness can be made thinner, and the possibility that the underfill overflows into the image sensing area may be reduced. In addition, the signal transmission path of the sensor die may be connected to the external signal by the conductive terminal via the conductive bump and the circuit layer. As a result, the cost of through silicon via may be eliminated to reduce the production cost of the semiconductor package structure.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor package structure, comprising:
   a sensing die having a sensing surface, wherein the sensing surface comprises an image sensing area and a plurality of conductive bumps;
   a substrate disposed on the sensing surface;
   a light blocking layer located between the substrate and the sensor die;
   a circuit layer disposed on the light blocking layer, wherein the sensor die is electrically connected to the circuit layer by the plurality of conductive bumps;
   a dam structure disposed on the substrate and surrounding the image sensing area, wherein opposite ends of the dam structure directly contact the sensor die and the light blocking layer, and wherein the sensor die, the substrate, the light blocking layer and the dam structure constitute a cavity; and an underfill disposed between the dam structure and the plurality of conductive bumps.

2. The semiconductor package structure according to claim 1, wherein a first space is provided between the plurality of conductive bumps and the dam structure.

3. The semiconductor package structure according to claim 1, wherein a sidewall of the dam structure close to the image sensing area is substantially aligned with a sidewall of the light blocking layer close to the image sensing area.

4. The semiconductor package structure according to claim 1, wherein the underfill completely covers sidewalls of the plurality of conductive bumps.

5. The semiconductor package structure according to claim 1, wherein the underfill completely covers a sidewall of the dam structure close to the plurality of conductive bumps.

6. The semiconductor package structure according to claim 1, further comprising:
 an insulating layer exposing a part of the circuit layer, wherein the underfill is interposed between the dam structure and the insulating layer.

7. The semiconductor package structure according to claim 6, wherein the underfill further completely covers a sidewall of the insulating layer close to the plurality of conductive bumps.

8. The semiconductor package structure according to claim 6, wherein a second space is provided between the plurality of conductive bumps and the insulating layer.

* * * * *